(12) United States Patent
Costello

(10) Patent No.: US 7,651,364 B2
(45) Date of Patent: Jan. 26, 2010

(54) CIRCUIT BOARD ASSEMBLY WITH LIGHT EMITTING ELEMENT

(75) Inventor: Brian Patrick Costello, Scotts Valley, CA (US)

(73) Assignee: Tyco Electronics Corporation, MIddletown, PA (US)

( * ) Notice: Subject to any disclaimer, the term of this patent is extended or adjusted under 35 U.S.C. 154(b) by 108 days.

(21) Appl. No.: 11/732,211

(22) Filed: Apr. 3, 2007

(65) Prior Publication Data

US 2008/0248661 A1   Oct. 9, 2008

(51) Int. Cl.
*H01R 3/00* (2006.01)
(52) U.S. Cl. .................................................... 439/489
(58) Field of Classification Search ......... 439/488–490, 439/74, 80; 362/555, 234, 200, 800; 385/56, 385/38, 92, 147
See application file for complete search history.

(56) References Cited

U.S. PATENT DOCUMENTS

| 4,915,466 | A | * | 4/1990 | Sorensen et al. | 385/56 |
| 5,067,785 | A | * | 11/1991 | Schirbl et al. | 385/38 |
| 5,119,174 | A | | 6/1992 | Chen | |
| 5,481,440 | A | * | 1/1996 | Oldham et al. | 362/555 |
| 6,617,786 | B1 | | 9/2003 | Centofante | |
| 6,921,183 | B2 | | 7/2005 | Yang et al. | |
| 2007/0109792 | A1 | * | 5/2007 | Chosa et al. | 362/341 |

* cited by examiner

*Primary Examiner*—Edwin A. Leon

(57) ABSTRACT

A circuit board assembly includes a circuit board having opposing first and second surfaces each extending between at least one edge surface that intersects the first and second surfaces. A light emitting element is mounted directly over the edge surface of the circuit board.

20 Claims, 7 Drawing Sheets

CIRCUIT BOARD ASSEMBLY WITH LIGHT EMITTING ELEMENT

BACKGROUND OF THE INVENTION

The invention relates generally to circuit board assemblies, and, more particularly, to circuit board assemblies that include light emitting elements.

Transceiver modules are used for making bi-directional connections to communication devices such as modems, network interfaces, and other electrical components or electrical systems such as computer systems and the like. The Small Form-Factor Pluggable (SFP) standard, which supports both fiber optic and copper based transceivers, includes specifications for transceivers that are reduced in size to achieve a higher port density. Typically, an SFP transceiver module is inserted into a complementary metal cage assembly that is mounted on a circuit board. In order to increase transceiver density on the circuit board, a stacked cage and connector system is sometimes used wherein the transceivers are arranged in rows and columns with each transceiver module plugged into a socket or receptacle in the cage.

In some applications, a status indicator, such as a light emitting diode (LED), is mounted on the circuit board to display the status of the SFP module or port. However, as the density of modules and associated components on circuit boards increases, it remains a challenge to accommodate the status indicators in the space available on the circuit board. Light pipes have sometimes been used to display the status indication at a location above, below, or beside the SFP modules or ports. For example, light pipes may be mounted adjacent the SFP modules or ports on a panel within which the metal cage assembly is mounted. However, space on the panel adjacent the SFP modules or ports may also be limited.

There is a need for an electrical connector assembly that includes a circuit board assembly having available space for a plurality of status indicators.

BRIEF DESCRIPTION OF THE INVENTION

In one embodiment, a circuit board assembly is provided. The circuit board assembly includes a circuit board having opposing first and second surfaces each extending between at least one edge surface that intersects the first and second surfaces. A light emitting element is mounted directly over the edge surface of the circuit board.

In another embodiment, a circuit board assembly is provided. The circuit board assembly includes a circuit board having a first surface that includes an electrically conductive material thereon. A light emitting element is mounted directly over an edge surface of the circuit board at least a portion of which is non-parallel with the first surface of the circuit board.

In another embodiment, an electrical connector assembly is provided. The electrical connector assembly includes a circuit board having opposing first and second surfaces each extending between at least one edge surface that intersects the first and second surfaces. The first surfaces includes an electrically conductive material thereon. A cage member is configured for mounting in an opening in a panel. The cage member has at least one compartment for receiving a pluggable electrical component therein. The cage member is mounted on the first surface of the circuit board. An electrical connector is disposed within the cage member and electrically connected to at least a portion of the electrically conductive material on the first surface of the circuit board. The electrical connector is configured to electrically connect to the pluggable electrical component when the pluggable electrical component is received within the compartment. A light emitting element is mounted directly over the edge surface of the circuit board.

DETAILED DESCRIPTION OF THE INVENTION

Figure 1:
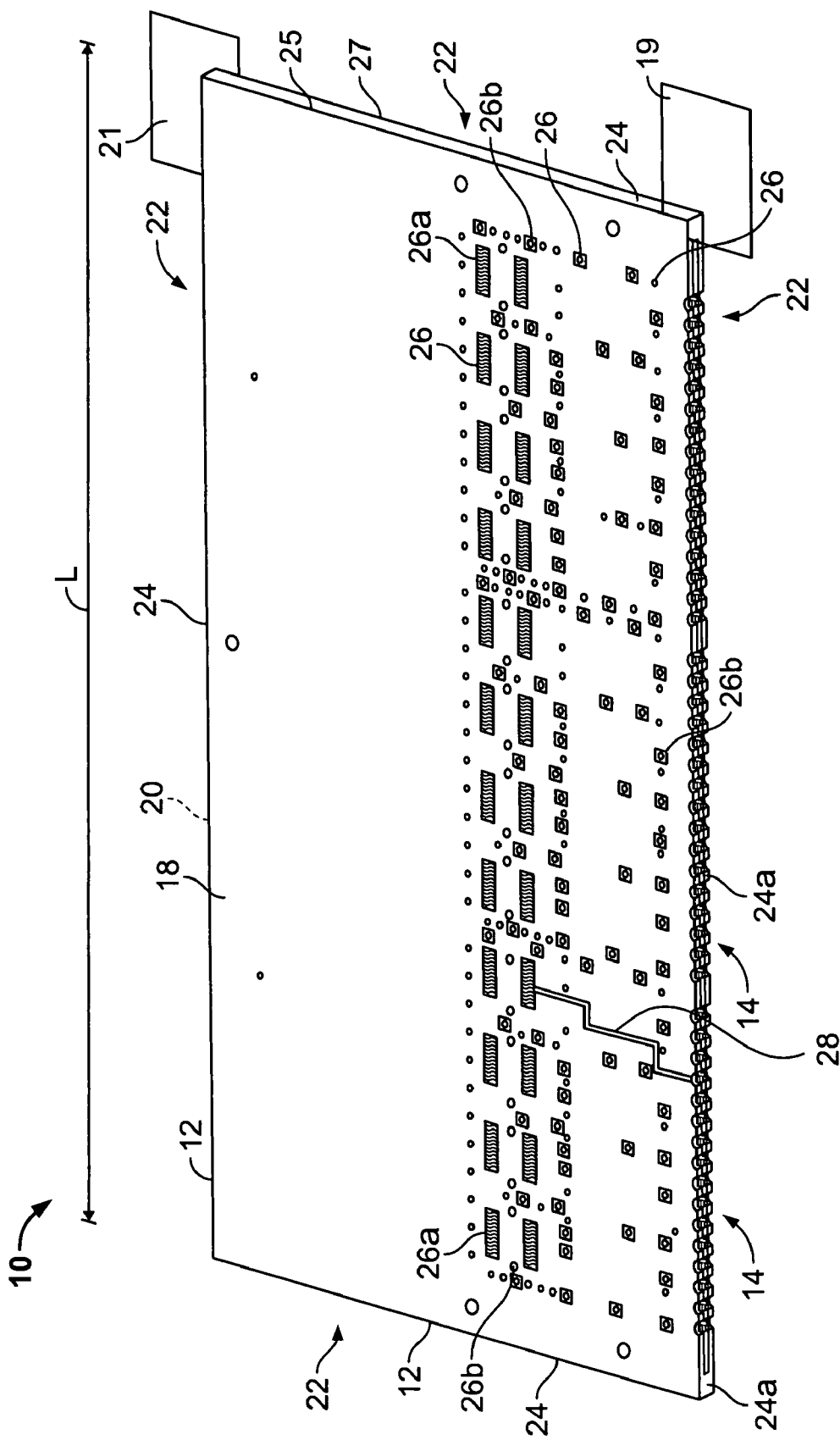
FIG. 1 is a top perspective view of an exemplary embodiment of a circuit board assembly.
Figure 2:
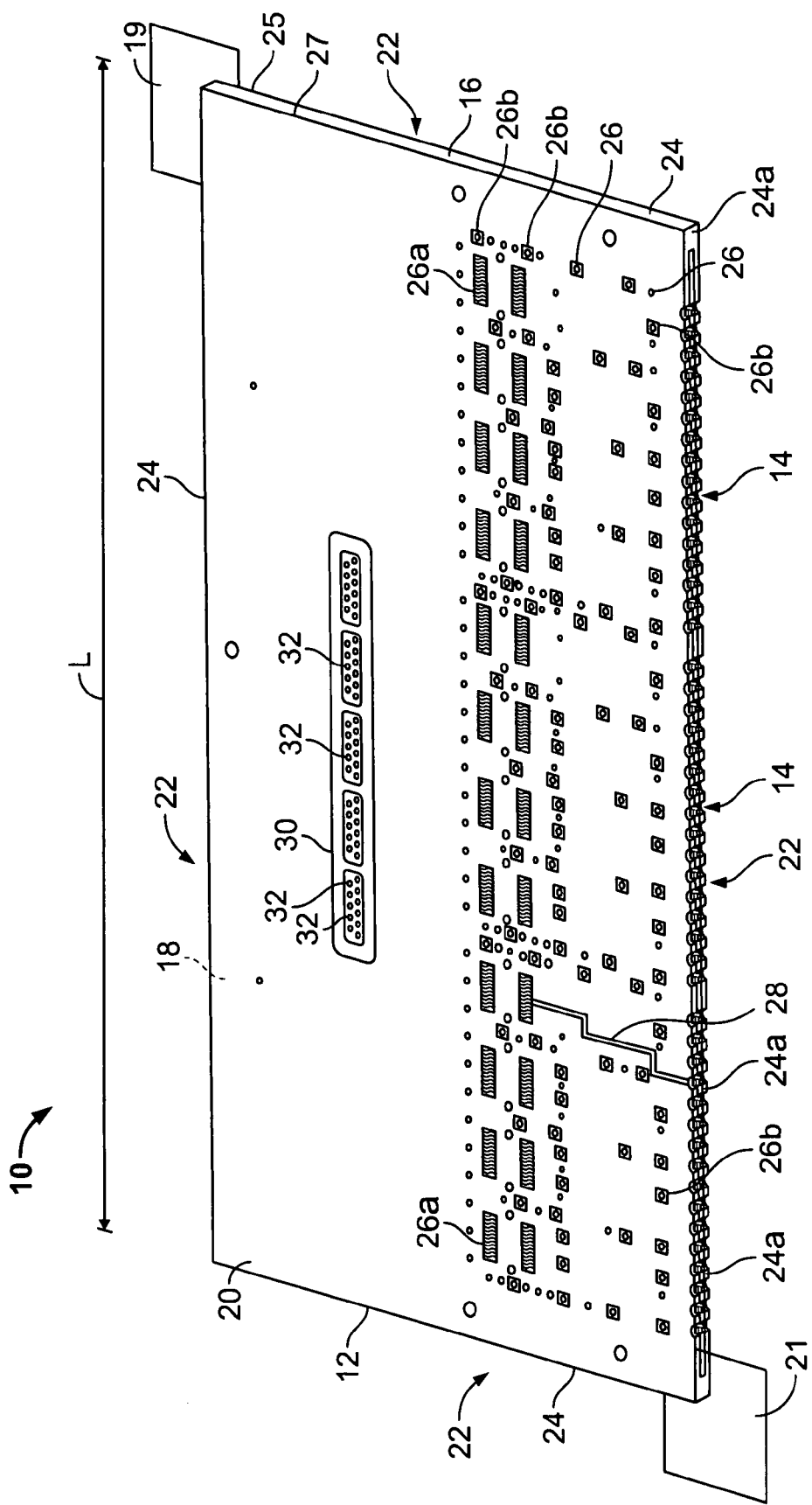
FIG. 2 is a bottom perspective view of the circuit board assembly shown in FIG. 1.

FIG. 1 is a top perspective view of a circuit board assembly 10 formed in accordance with an exemplary embodiment. FIG. 2 is a bottom perspective view of the circuit board assembly 10. The circuit board assembly 10 includes a circuit board 12 and a plurality of light emitting elements 14 mounted on the circuit board 12. The circuit board 12 includes a dielectric substrate 16 having a pair of opposing surfaces 18 and 20 that each extend between a plurality of edge portions 22. In the exemplary embodiment, the surfaces 18 and 20 are each generally planar and extend substantially parallel to each other. Each of the surfaces 18 and 20 lies within a respective plane 19 and 21. A distance between the planes 19 and 21 defines a thickness T (FIG. 3) of the circuit board 12 adjacent the edge portions 22. Each edge portion 22 includes an edge surface 24 that intersects the surfaces 18 and 20. The intersection between each edge surfaces 24 and the surfaces 18 and 20 defines a respective edge 25 and 27. Each edge portion 22 also includes a portion of the surfaces 18 and 20 adjacent the corresponding edge surface 24. In the exemplary embodiment, the edge surfaces 24 each extend substantially perpendicular to each of the surfaces 18 and 20. Each of the surfaces 18 and 20 include a plurality of electrical contacts 26 thereon. In some alternative embodiments, only one of the surfaces 18 or 20 includes the electrical contacts 26. In the exemplary embodiment, the electrical contacts 26 include electrically conductive pads 26a and through holes 26b that are plated with an electrically conductive material. Optionally, the circuit board 12 includes one or more electrically conductive traces 28 on the surfaces 18 and/or 20, as shown in FIGS. 1 and 2. Alternatively, only one, or neither, of the surfaces 18 or 20 includes the electrical contacts 26 and/or the electrically conductive traces 28 thereon. Moreover, the circuit board 12 may include one or more internal electrically conductive traces (not shown) and/or internal electrical contacts (not shown) that are formed internally within the circuit board 12. The electrical contacts 26 may be either signal contacts, ground contacts, or power contacts.

In the exemplary embodiment, the circuit board 12 includes an interface connector 30 on the surface 20. The interface connector 30 includes a plurality of electrical contacts 32 for electrically connecting the circuit board 12 to another electrical device, such as, but not limited to, a linecard (e.g., the linecard 102 shown in FIGS. 4 and 5) of a host system (not shown). The electrical contacts 32 of the interface connector 30 may be electrically connected to some or all of the electrical contacts 26 of the circuit board 12, for example via internal electrical contacts, internal electrically conductive traces, and/or electrically conductive traces (not shown) on the surfaces 18 and/or 20 of the circuit board 12, thereby forming electrical circuits of the circuit board 12. Optionally, the holes 26b electrically connect one or more circuits on the circuit board surface 18 with one or more circuits on the opposing surface 20.

In some alternative embodiments, one or more of the edge surfaces 24 may extend at any non-perpendicular angle relative to the surfaces 18 and/or 20. The opposing surfaces 18 and 20 of the circuit board may alternatively extend at any non-parallel angle relative to each other. Moreover, the surfaces 18 and/or 20 may be non-planar in some alternative embodiments. The dielectric substrate 16 of the circuit board 12 may be fabricated from any suitable material(s), such as, but not limited to plastic, breadboard, glass, and/or the like. Although shown as generally rectangular, the dielectric substrate 16 may have any suitable shape, which may define any number of edge portions 22.

Figure 3:
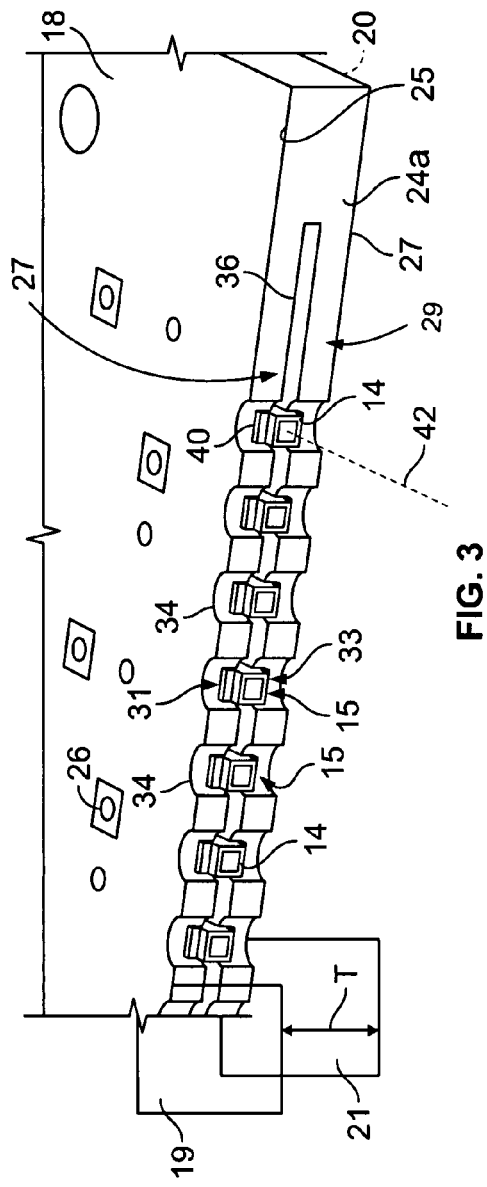
FIG. 3 is a perspective view of a portion of the circuit board assembly shown in FIGS. 1 and 2.

FIG. 3 is a perspective view of a portion of the circuit board assembly 10. As described above, a plurality of light emitting elements 14 are mounted on the circuit board 12. Specifically, the light emitting elements 14 are mounted directly over one of the edge surfaces 24a. As used herein, the term "directly over" is intended to mean that at least a majority of a body 15 of each of the light emitting elements 14 extends over the edge surface 24a within the thickness T of the circuit board 12 defined between the pair of planes 19 and 21. In the exemplary embodiment, the entirety of each of the light emitting element bodies 15 extends within the thickness T such that each of the light emitting element bodies 15 does not extend over either of the surfaces 18 or 20, but rather is separate and remote from each of the surfaces 18 and 20. However, in some alternative embodiments a portion of the one or more of the light emitting element bodies 15 may extend outside of the thickness T so long as a majority of the body 15 extends within the thickness T. In embodiments wherein the surfaces 18 and/or 20 are not generally planar, the planes 19 and 21 may be any plane that a portion of the respective surface 18 and 20 lies within and that intersects the respective edge 25 and 27.

The light emitting elements 14 may be mounted directly over the edge surface 24a in any suitable configuration, arrangement, orientation, location, position, and/or using any suitable structure and/or means that enables the light emitting elements 14 to function as described herein. In the exemplary embodiment, each light emitting element 14 is mounted within a corresponding recess 34 formed within the edge surface 24a. The recesses 34 may have any suitable size and shape that enables the light emitting elements 14 to function as described herein. In the exemplary embodiment, each of the portions of the edge surface 24a that define the recesses 34 has an arcuate shape and extends from the surface 18 to the opposing surface 20. The edge surface 24a further includes a slot 36 extending along a portion of the length L (FIG. 2) of the edge surface 24a. The slot 36 intersects the recesses 34. Optionally, the edge surface 24a does not include one or more of the recesses 34 such that one or more of the light emitting elements are mounted directly over a substantially planar portion of the edge surface 24a.

The light emitting elements 14 may be held directly over the edge portion 24a using any suitable structure and/or means that enables the light emitting elements 14 to be securely held directly over the edge surface 24a, such as, but not limited to, using an adhesive, a press or snap-fit arrangement, solder, an electrically conductive epoxy, and/or the like. In the exemplary embodiment, the light emitting elements 14 soldered to the edge surface 24a. Alternatively, one or more of the light emitting elements 14 may be attached to a base (not shown) that is held within the slot 36. Moreover, in some alternative embodiments, the light emitting elements 14 may be held directly over the edge portion 24a using an attachment mechanism(s) (not shown) that attaches to the surfaces 18 and/or 20. For example, an L-shaped bracket (not shown) may extend outwardly from an end portion 31 and/or an end portion 33 of one or more of the light emitting element bodies 15 and overlap the surfaces 18 and/or 20.

The light emitting elements 14 may optionally be electrically connected to the electrical contacts 26 on the surfaces 18 and/or 20 to electrically connect the light emitting elements 14 to the circuits of the circuit board 12. Additionally or alternatively, the light emitting elements 14 are electrically connected to one or more other circuits (not shown) that are not a component of the circuit board 12. The light emitting elements 14 may be electrically connected to the contacts 26 using any suitable structure and/or means. In the exemplary embodiment, the edge surface 24a includes an electrically conductive material thereon and the slot 36 electrically isolates the edge surface 24a into and upper portion 27 and a lower portion 29. Each of the light emitting elements 14 includes a pair of electrical contacts (not shown) on the surface 40. The electrical contacts of the light emitting elements 14 are each electrically connected to the electrically conductive material of a corresponding one of the upper and lower portions 27 and 29, respectively, of the surface 24a (e.g., via the solder in the exemplary embodiment). The electrically conductive material on the upper and lower portions 27 and 29, respectively, of the surface 24a may be electrically connected to one or more electrical contacts 26 to electrically connect the light emitting elements 14 to one or more of the electrical contacts 26. For example, in the exemplary embodiment, the upper and lower portions 27 and 29, respectively, of the edge surface 24a are each electrically connected to an electrical contact 26a via a corresponding electrically conductive trace 28. Additionally or alternatively, the upper and/or lower portions 27 and 29, respectively, of the edge surface 24a are electrically connected to one or more electrical contacts 26 (e.g., a contact 26a) via internal electrical contacts and/or internal electrically conductive traces of the circuit board 12. Any other suitable electrical connection that enables the light emitting elements 14 to be electrically connected to the contacts 26 may be used, such as, but not limited to, using electrically conductive wires (not shown).

The light emitting elements 14 may each be any suitable type of light emitting device, such as, but not limited to, a light emitting diode (LED) or a light pipe. Although a specific plurality of light emitting elements 14 are shown, the circuit board 12 may include any number of light emitting elements 14 mounted thereon. Moreover, although the light emitting elements 14 are shown as being mounted over only one of the edge surfaces 24a of the circuit board 12, the light emitting elements may additionally or alternatively be mounted over one or more of the other edge surfaces 24 of the circuit board 12.

In the exemplary embodiment, the light emitting elements 14 are each mounted on the circuit board 12 such that a light emitting axis 42 thereof extends substantially parallel with the surfaces 18 and 20. The light emitting axis 42 extends in the general direction of light emitted from the element 14. As will be described in more detail below, the exemplary orientation of the light emitting axes 42 allows light emitted by each of the elements 14 to be visible through a corresponding opening (e.g., the openings 118) within a panel (e.g., the panel 106 shown in FIGS. 4 and 5) adjacent which the circuit board 12 may be mounted.

Figure 4:
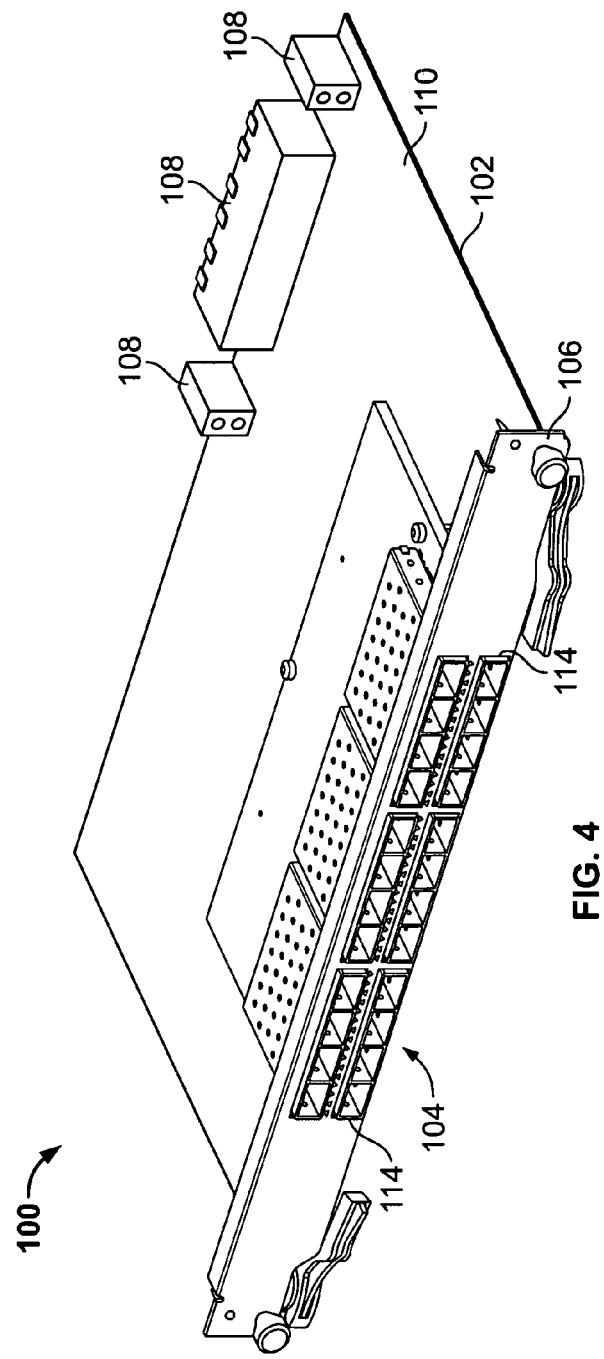
FIG. 4 is a perspective view of an exemplary embodiment of a linecard assembly.
Figure 5:
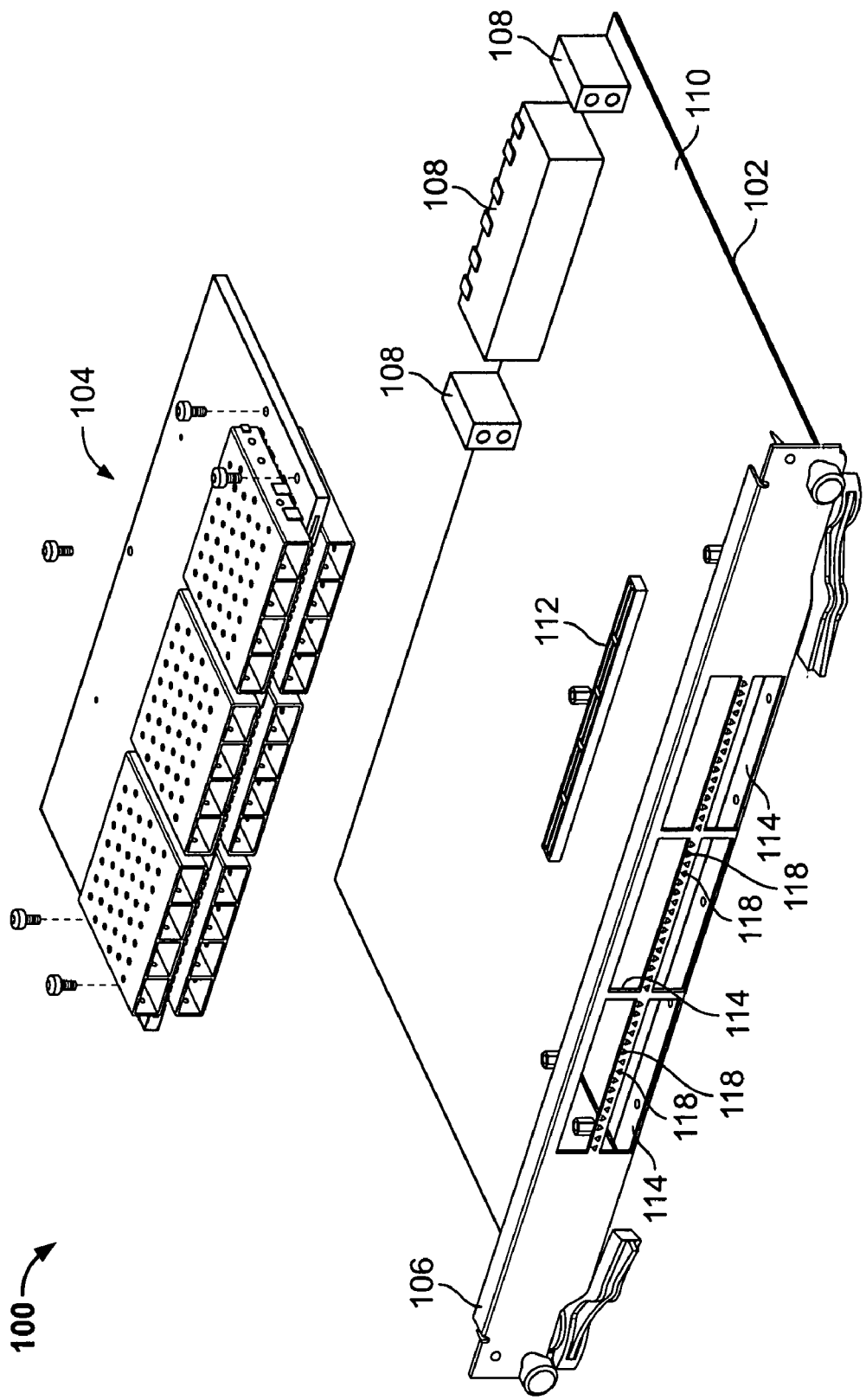
FIG. 5 is an exploded perspective view of the linecard assembly shown in FIG. 4.

FIG. 4 is a perspective view of an exemplary embodiment of a linecard assembly 100 which may be mounted in a host system (not shown). FIG. 5 is an exploded perspective view of the linecard assembly 100. The assembly 100 includes a linecard 102, an electrical connector assembly 104 mounted on the linecard 102, and a faceplate, or panel 106, mounted on the linecard 102. The linecard 102 includes a plurality of backplane connectors 108 mounted on a surface 110 thereof for electrical connection between the linecard 102 and a backplane (not shown) of the host system. The linecard 102 also includes an interface connector 112 mounted on the surface 110 to electrically connect the linecard 102 with the electrical connector assembly 104 via the interface connector 30 (FIGS. 2 and 7) of the circuit board assembly 104, as will be described in more detail below. The interface connector 112 of the linecard 102 is electrically connected to the backplane connectors 108, for example using an electrically conductive trace (not shown) on the linecard 102.

The panel 106 includes a plurality of openings 114 that enable the electrical connector assembly 104 to receive a plurality of pluggable electrical components (not shown) therein through the panel 106. The pluggable electrical components may, in one embodiment, may be Small Form Factor Pluggable (SFP) compliant transceiver modules having high speed data transmission capability. It is to be understood, however, that the benefits and advantages of the embodiments described and/or illustrated herein may accrue equally to other types of electrical components, across a variety of systems and standards. Therefore, while the embodiments are described in the context of SFP modules, the embodiments are not intended to be limited thereto and the SFP modules are described for purposes of illustration rather than limitation. Although the panel 106 is shown as having six openings 114, the panel 106 may any include any number of openings for accommodating any number of electrical components. The panel 106 also includes a plurality of openings 118 that enable light emitted by the light emitting elements 14 to be visible through the panel 106, as will be described in more detail below.

Figure 6:
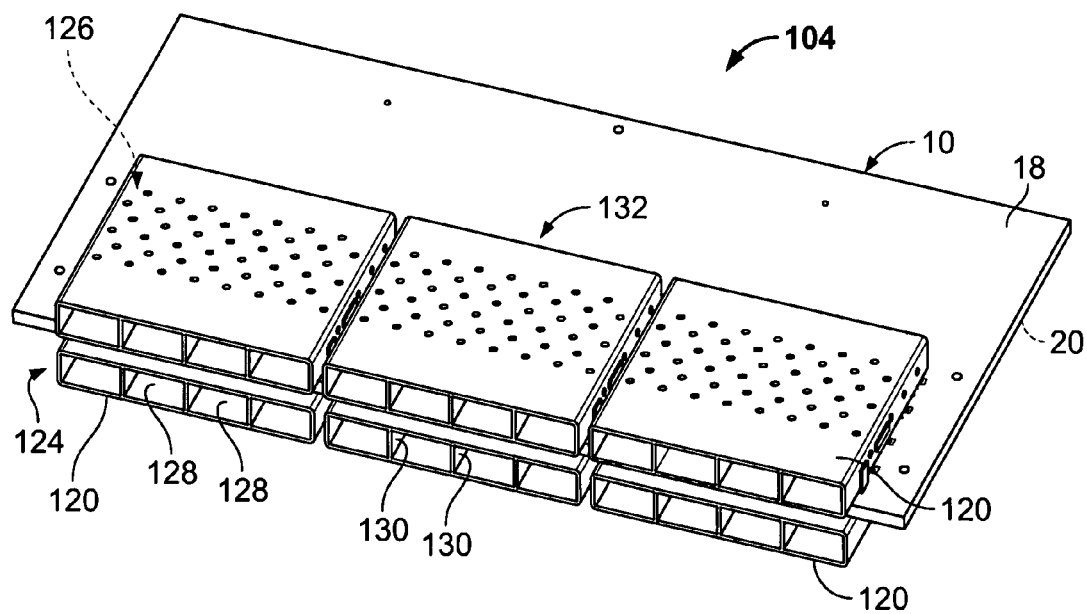
FIG. 6 is a top perspective view of an exemplary embodiment of an electrical connector assembly of the linecard assembly shown in FIGS. 4 and 5.
Figure 7:
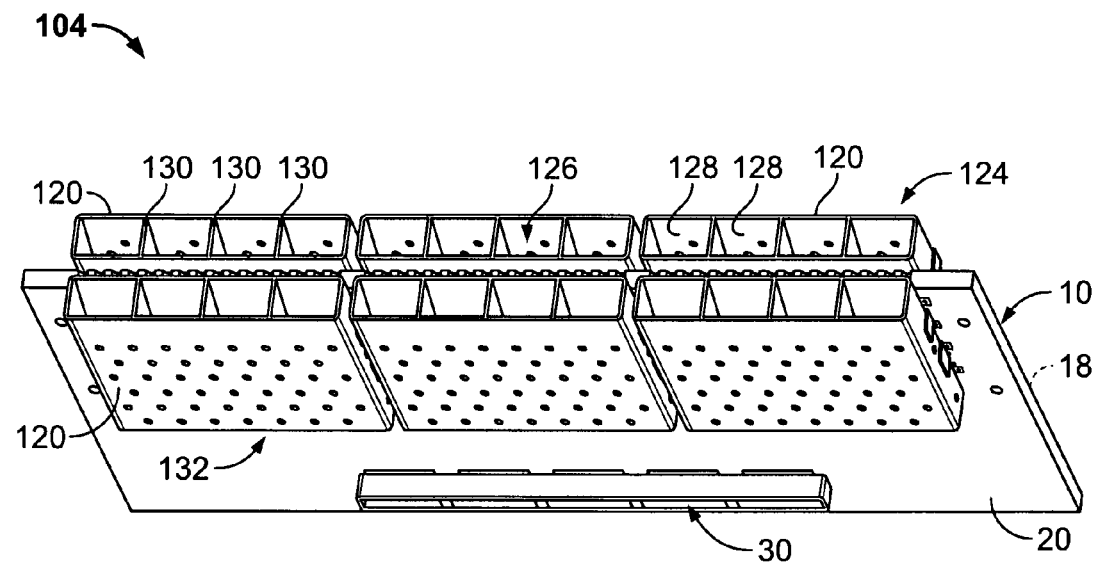
FIG. 7 is a bottom perspective view of the electrical connector assembly shown in FIG. 6.
Figure 8:
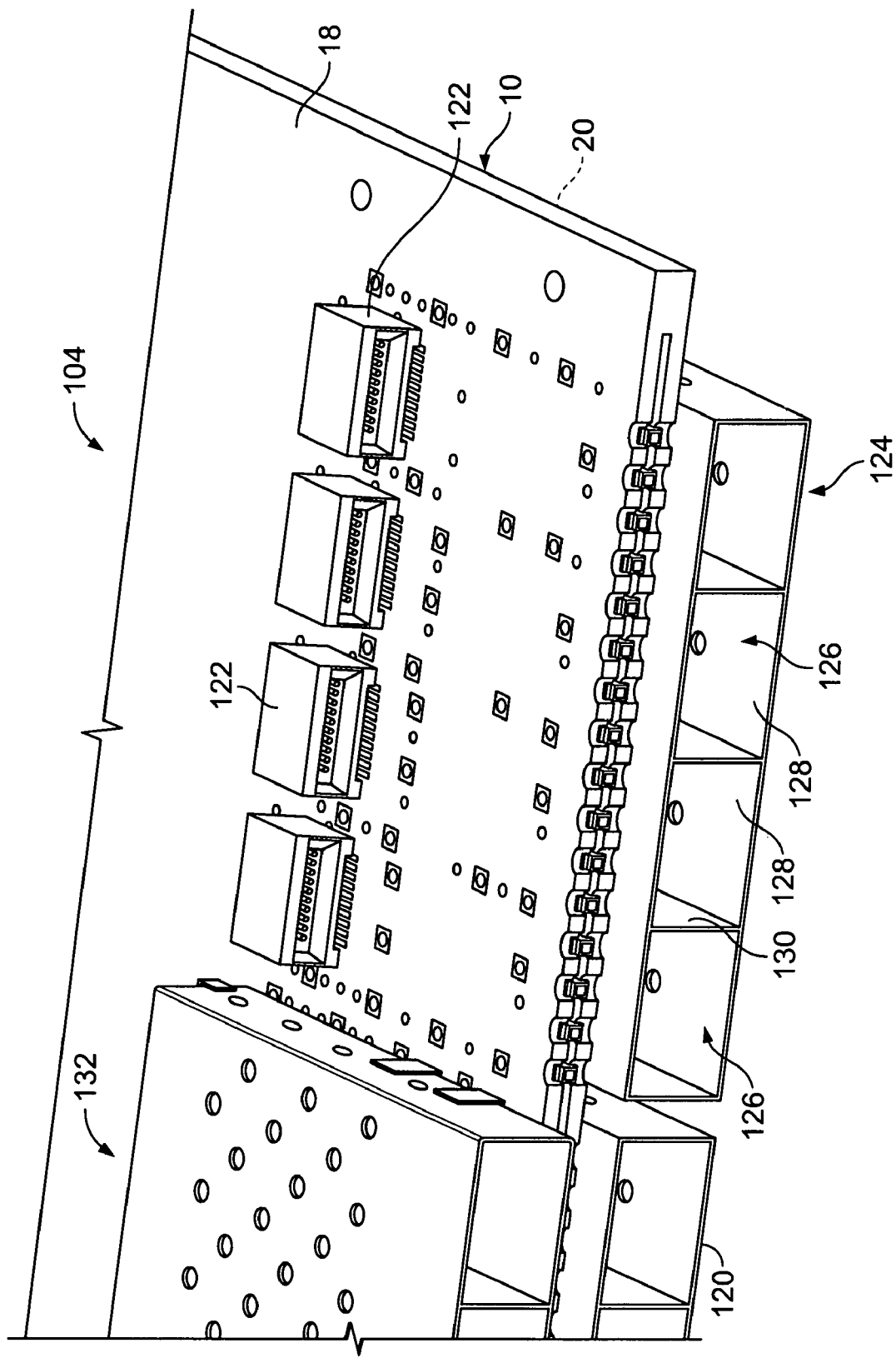
FIG. 8 is a partially cut-away perspective view of a portion of the electrical connector assembly shown in FIGS. 6 and 7.

FIG. 6 is a top perspective view of the electrical connector assembly 104. FIG. 7 is a bottom perspective view of the electrical connector assembly 104. FIG. 8 is a partially cut-away perspective view of a portion of the electrical connector assembly 104. The assembly 104 includes the circuit board assembly 10 and a plurality of shielded cage members 120 mounted opposite one another on the opposite sides 18 and 20 of the circuit board 12. Alternatively, the electrical connector assembly includes one or more shielded cage members 120 mounted on only one of the sides 18 or 20. One or more electrical connectors 122 (FIG. 8) are positioned within each of the cage members 120. An end portion 124 of each of the cage members 120 is configured to be mounted, or received, within a corresponding one of the panel openings 114 (FIGS. 4 and 5).

In the exemplary embodiment, the cage members 120 each include a generally rectangular cross section and the panel openings 114 each include a generally rectangular shape. However, the cage members 120 and the panel openings 114 may each include any suitable shape that enables each of the cage member end portions 124 to be received within the corresponding panel opening 114. The cage members 120 each include an internal chamber 126 that is subdivided into a plurality of internal compartments 128, which are arranged in a row. Specifically, in the exemplary embodiment, the cage members 120 each include three divider walls 130 that divide the internal compartments 128 into four columns. Each internal compartment 128 is configured to at least partially receive one of the pluggable electrical components therein. The cage members 120 each include one or more openings (not shown) adjacent an end portion 132 that is opposite the end portion 124 for at least partially receiving a corresponding one of the electrical connector 122 within each of the internal compartments 128 of the corresponding cage member 120. When the pluggable electrical components are received within the corresponding internal compartment 128, the electrical component is engaged with and electrically connected to the corresponding electrical connector 122. The interface connector 30 (FIGS. 2 and 7) on the circuit board 12 engages the interface connector 112 (FIG. 5) on the linecard 102 to electrically connect the circuit board 12 to the linecard 102. Each of the electrical connectors 122 is electrically connected to the electrical contacts 26 and/or the electrically conductive traces 28 on the circuit board 12 to provide an electrical connection between the corresponding pluggable electrical component and the circuit board 12, and therefore the linecard 102.

Although the electrical connector assembly 104 is shown as including six cage members 120, the assembly 104 may include any number of cage members 120. Moreover, although the cage members 120 are each shown as including four internal compartments 128 arranged in one row, the cage members 120 may each include any number of internal compartments 128, arranged in any number of rows and columns, for receiving any number of pluggable electrical components.

Figure 9:
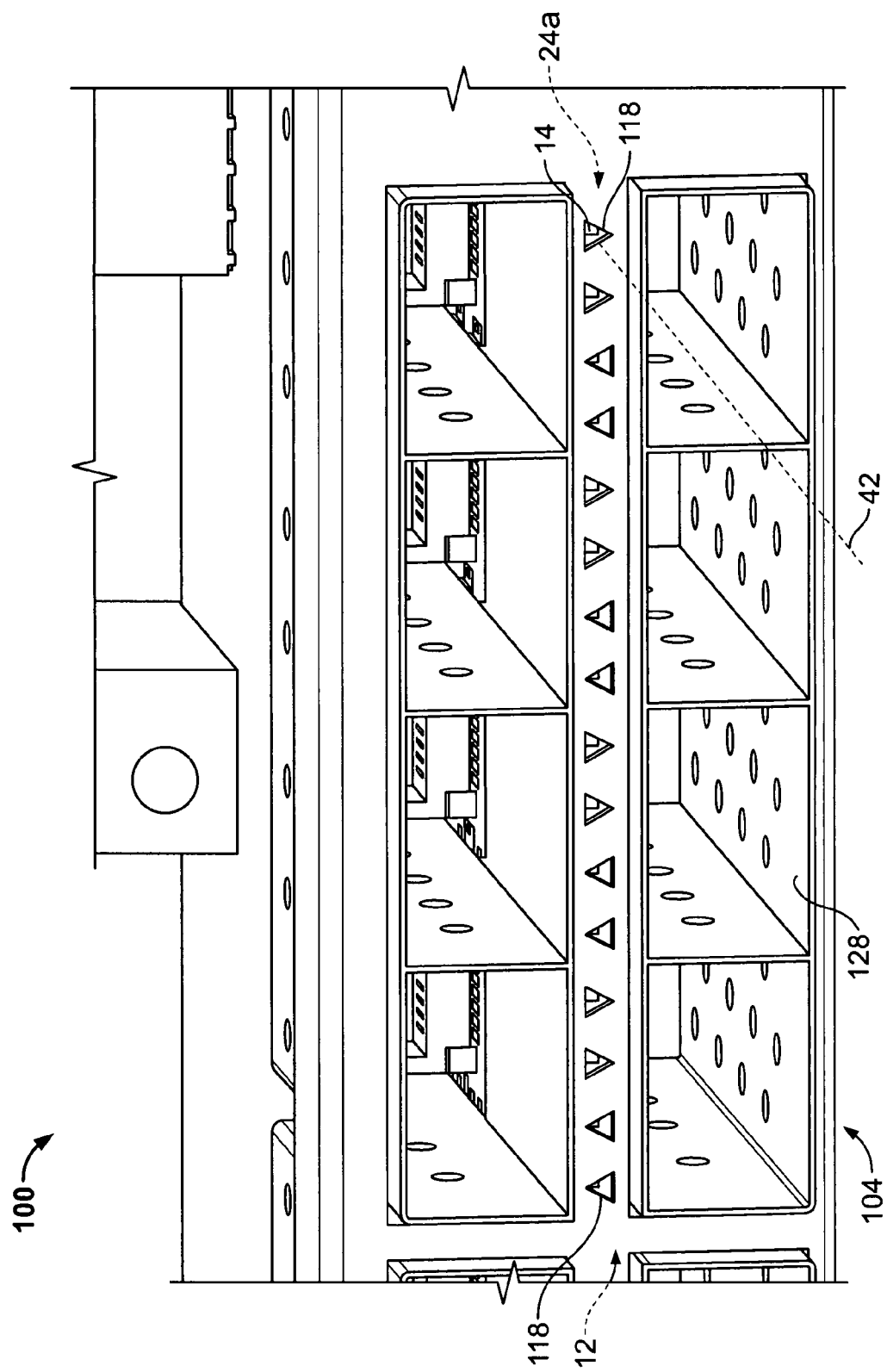
FIG. 9 is a perspective view of a portion of the linecard assembly shown in FIGS. 4 and 5.

In operation, and referring now to FIGS. 4 and 9, when the electrical connector assembly 104 is mounted on the linecard 102, the light emitting elements 14 mounted on the edge surface 24a of the circuit board 12 are each aligned with a corresponding one of the openings 118 within the panel 106. Specifically, the light emitting axis 42 of each of the light emitting elements 14 is aligned with the corresponding opening 118 such that light is emitted from the element 14 through the corresponding opening 118. As such, light emitted by each light emitting element 14 is visible through the corresponding opening 118. The light emitting elements 14 may provide an indication of a status of the assembly 100 such as, but not limited to, whether the corresponding pluggable electrical component is plugged into the corresponding internal compartment 128, and/or whether the corresponding electrical connector 122 (FIG. 8) and/or the corresponding pluggable electrical component is operational and/or is sending or receiving data. The light emitting elements 14 may alternatively indicate other statuses, operations, failures, and/or the like.

The embodiments described and illustrated herein provides an electrical connector assembly that includes a circuit board that may accommodate more light emitting elements than at least some known circuit boards.

Although the embodiments are described and illustrated herein for use with a linecard assembly, it is to be understood that the benefits and advantages of the embodiments described and/or illustrated herein may accrue equally to other types of electrical connectors besides linecards, across a variety of systems and standards. Therefore, while the embodiments are described and illustrated in the context of the linecard assembly 100, the embodiments are not intended to be limited thereto and the assembly 100 is provided for purposes of illustration rather than limitation. Rather, the embodiments described and illustrated herein may be used with for any circuit board that includes light emitting elements.

Exemplary embodiments are described and/or illustrated herein in detail. The embodiments are not limited to the specific embodiments described herein, but rather, components and/or steps of each embodiment may be utilized independently and separately from other components and/or steps described herein. Each component, and/or each step of one embodiment, can also be used in combination with other components and/or steps of other embodiments. For example, although specific sensor elements are described and/or illustrated with specific attachment devices, each described and/or illustrated sensor element may be used with any of the described and/or illustrated attachment devices as is appropriate. When introducing elements/components/etc. described and/or illustrated herein, the articles "a", "an", "the", "said", and "at least one" are intended to mean that there are one or more of the element(s)/component(s)/etc. The terms "comprising", "including" and "having" are intended to be inclusive and mean that there may be additional element(s)/component(s)/etc. other than the listed element(s)/component(s)/etc. Moreover, the terms "first," "second," and "third," etc. in the claims are used merely as labels, and are not intended to impose numerical requirements on their objects. Further, the limitations of the following claims are not written in means—plus-function format and are not intended to be interpreted based on 35 U.S.C. § 112, sixth paragraph, unless and until such claim limitations expressly use the phrase "means for" followed by a statement of function void of further structure.

While the invention has been described in terms of various specific embodiments, those skilled in the art will recognize that the invention can be practiced with modification within the spirit and scope of the claims.

What is claimed is:

1. A circuit board assembly comprising:
    a circuit board having opposing first and second surfaces each extending between at least one edge surface that intersects the first and second surfaces, at least one of the first and second surfaces comprising an electrically conductive material thereon; and
    a light emitting element mounted directly over the edge surface of the circuit board such that an entirety of a body of the light emitting element extends within a thickness of the circuit board.

2. A circuit board assembly according to claim 1, wherein the light emitting element comprises a light emitting diode (LED).

3. A circuit board assembly according to claim 1, wherein at least a portion of the edge surface of the circuit board extends substantially perpendicular to the first and second surfaces of the circuit board.

4. A circuit board assembly according to claim 1, wherein the light emitting element is mounted over the edge surface such that a light emitting axis of the light emitting element extends substantially parallel with the first and second surfaces of the circuit board.

5. A circuit board assembly according to claim 1, wherein the electrically conductive material comprises at least one of an electrical contact and an electrical trace.

6. A circuit board assembly according to claim 1, wherein the edge surface of the circuit board comprises an edge width that defines the thickness of the circuit board, the edge width of the edge surface being smaller than at least one of a length and a width of at least one of the first and second surfaces.

7. A circuit board assembly according to claim 1, wherein the edge surface of the circuit board comprises a recess therein, and the light emitting element is mounted over the edge surface at least partially within the recess.

8. A circuit board assembly according to claim 7, wherein the portion of the edge surface defining the recess comprises an arcuate shape.

9. A circuit board assembly according to claim 7, wherein the recess extends through the first and second surfaces of the circuit board.

10. A circuit board assembly comprising:
    a circuit board having a first surface comprising an electrically conductive material thereon; and
    a light emitting element mounted directly over an edge surface of the circuit board such that an entirety of a body of the light emitting element extends within a thickness of the circuit board, at least a portion of the edge surface being non-parallel with the first surface of the circuit board.

11. A circuit board assembly according to claim 10, wherein the light emitting element comprises a light emitting diode (LED).

12. A circuit board assembly according to claim 10, wherein the edge surface of the circuit board forms at least a portion of an edge portion of the circuit board.

13. A circuit board assembly according to claim 10, wherein at least a portion of the edge surface of the circuit board extends substantially perpendicular to the first surface of the circuit board.

14. A circuit board assembly according to claim 10, wherein the edge surface of the circuit board comprises a recess therein, and the light emitting element is mounted over the edge surface at least partially within the recess.

15. A circuit board assembly according to claim 10, wherein the edge surface of the circuit board comprises an edge width that defines the thickness of the circuit board, the edge width of the edge surface being smaller than at least one of a length and a width of the first surface.

16. A circuit board assembly according to claim 10, wherein the light emitting element is mounted over the edge surface such that a light emitting axis of the light emitting element extends substantially parallel with the first surface of the circuit board.

17. A circuit board assembly according to claim 10, wherein the electrically conductive material on the first surface of the circuit board comprises at least one of an electrical contact and an electrical trace.

18. An electrical connector assembly comprising:
    a circuit board having opposing first and second surfaces each extending between at least one edge surface that intersects the first and second surfaces, the first surface comprising an electrically conductive material thereon;
    a cage member configured for mounting in an opening in a panel, the cage member having at least one compartment for receiving a pluggable electrical component therein, the cage member being mounted on the first surface of the circuit board;
    an electrical connector disposed within the cage member and electrically connected to at least a portion of the electrically conductive material on the first surface of the circuit board, the electrical connector configured to electrically connect to the pluggable electrical component when the pluggable electrical component is received within the compartment; and a light emitting element mounted directly over the edge surface of the circuit board.

19. An electrical connector assembly according to claim 18, wherein the light emitting element comprises a light emitting diode (LED).

20. An electrical connector assembly according to claim 18, wherein the opening in the panel is a first opening, and the light emitting element is mounted over the edge surface of the circuit board such that the light emitting element is configured to emit light through a second opening within the panel when the cage member is mounted within the first opening of the panel.

* * * * *